Figure 1:
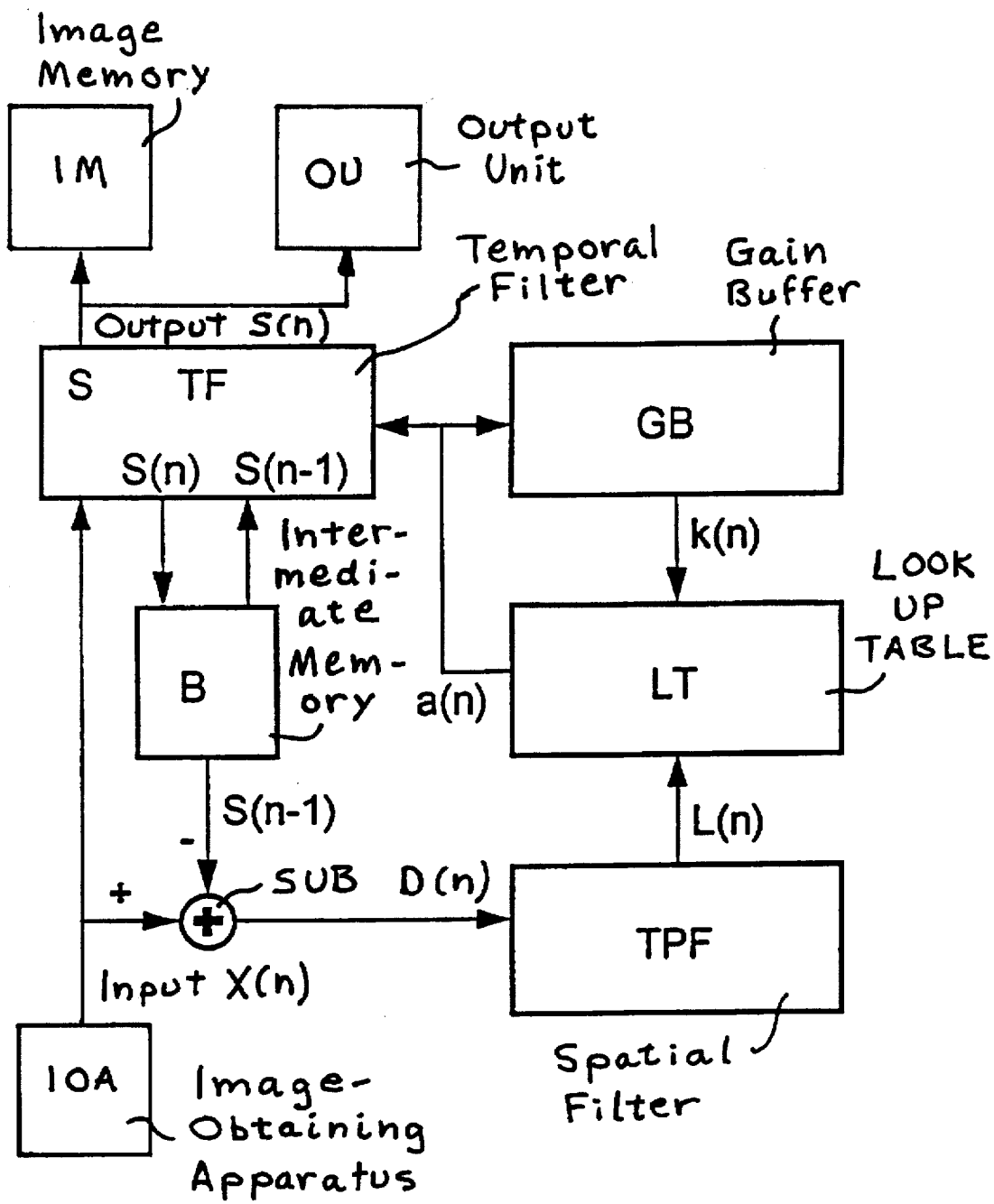

United States Patent [19]
Hein

[11] Patent Number: 5,684,720
[45] Date of Patent: Nov. 4, 1997

[54] METHOD AND APPARATUS FOR ADAPTIVELY PRODUCING NOISE-REDUCED DIGITAL IMAGE SEQUENCES

[75] Inventor: Sören Hein, Munich, Germany

[73] Assignee: Siemens Aktiengesellschaft, Munich, Germany

[21] Appl. No.: 444,422

[22] Filed: May 19, 1995

[30] Foreign Application Priority Data

May 19, 1994 [DE] Germany ............... 44 17 628.7

[51] Int. Cl.⁶ .................. H03H 21/00; H04N 5/213
[52] U.S. Cl. .................. 364/574; 348/618; 378/98.6
[58] Field of Search .................. 364/574, 413.13, 364/514 R, 724.17, 724.19; 382/275; 358/447; 378/98.2–98.9; 348/620, 618

[56] References Cited

U.S. PATENT DOCUMENTS

| | | | |
|---|---|---|---|
| 4,240,109 | 12/1980 | Michael et al. | 358/105 |
| 4,367,490 | 1/1983 | Riederer | 348/620 |
| 5,214,510 | 5/1993 | Kobayashi | 358/167 |
| 5,442,407 | 8/1995 | Iu | 348/620 |
| 5,467,380 | 11/1995 | Jonge et al. | 378/98.2 |

FOREIGN PATENT DOCUMENTS 0 064 192  11/1982  European Pat. Off. .

*Primary Examiner*—Emanuel T. Voeltz
*Assistant Examiner*—Kamini S. Shah
*Attorney, Agent, or Firm*—Hill Steadman & Simpson

[57] ABSTRACT

In a method and apparatus for adaptive noise reduction of digital image sequences an input sequence of images obtained from a subject is subjected to pixel-by-pixel, temporal low-pass filtering, with the sequence of filter coefficients for this temporal low-pass filtering being calculated recursively with reference to a spatially low-pass-filtered prediction error and an a priori probability for the occurrence of motion in the image.

2 Claims, 1 Drawing Sheet

METHOD AND APPARATUS FOR ADAPTIVELY PRODUCING NOISE-REDUCED DIGITAL IMAGE SEQUENCES

BACKGROUND OF THE INVENTION

1. Field of the Invention

The present invention is directed to a method and apparatus for adaptively producing noise-reduced digital image sequences.

2. Description of the Prior Art

An optimally effective elimination of noise influences plays a significant part in various applications of digital image processing, particularly when processing x-ray images within the scope of digital substraction angiography (DSA). As a result, for example, the x-ray dose can be lowered, permitting fine picture details such as small blood vessels or catheters to be clearly resolved in the image.

SUMMARY OF THE INVENTION

An object of the present invention is to provide a method for adaptive noise reduction for digital image sequences which supplies especially high-quality images from which noise influences have been largely eliminated, whereby fine image details such as blood vessels are optimally well-preserved in DSA images at the same time.

This objective is achieved in a method and apparatus wherein a pixel-by-pixel, temporal low-pass filtering is combined with spatial low-pass filtering, whereby the sequence of the filter coefficients of the temporal low-pass filtering is calculated on the basis of a spatially low-pass-filtered prediction error and an a priori probability for the appearance of motion.

The inventive method employs a new generalization of a temporal filter of the Kalman type with which the noise suppression and the detection of motion are achieved simultaneously in an approximately optimum way. The inventive method is especially well-suited for implementation using specific integrated circuits (ASICs) and can be implemented in real time in this case.

DESCRIPTION OF THE DRAWINGS

FIG. 1 is a block diagram showing the structure of an electronic system constructed in accordance with the principles of the present invention for the implementation of the inventive method.

DESCRIPTION OF THE PREFERRED EMBODIMENTS

The method and apparatus of the invention are directed to processing digital image sequences processing digital image sequences to obtain a high-quality image sequence, for example processing x-ray image sequences in digital subtraction angiography (DSA). The x-ray dose can be reduced by virtue of the noise suppression achieved with the inventive method and apparatus, permitting fine image details such as blood vessels or catheters to be preserved unmodified. FIG. 1 schematically shows the structure of an electronic system for the implementation of the inventive method.

As shown in FIG. 1, a first image sequence X is obtained from an image obtaining apparatus IOA, such as an x-ray apparatus which includes at least an x-ray source and a radiation detector, and an analog to digital converter so that the first sequence X is a digital sequence of images. The chronological location of each image in the sequence X is designated by n, so that the image obtaining apparatus IOA supplies an input X(n) to the remainder of the system shown in FIG. 1. The input sequence X(n) is supplied to a subtraction unit SUB as well as to a temporal (chronological) low pass filter TF. By means of the recursive procedure described below, the temporal filter TF produces a second sequence S of images, these images being reduced in noise compared to the input sequence X(n). Again, the index n identifies the chronological position of an individual image in the sequence S, thereby resulting in an output sequence S(n). This output sequence is supplied optionally to an image memory IM or to an output unit OU, and is also supplied, at another output of the temporal filter TF to an intermediate memory B. This is so that, when the next image in the sequence X(n) is supplied to the temporal filter TF, the previous image (now designated S(n−1) due to the current image being designated S(n)), can be subtracted from the current image in the input sequence X(n) in the subtraction unit SUB. This subtraction produces a difference image D(n), which is supplied to a spatial filter TPF. The difference image D(n) is a prediction error of the amount of movement in the subtracted images, and the spatially low pass filtered prediction error L(n) at the output of the spatial filter TPF is then supplied to a look up table LT. Based on a variance factor k(n) supplied from a gain buffer GB, the look up table LT produces a filter coefficient a(n) which is supplied both to the temporal filter TF and to the gain buffer GB.

The images X(n) of the sequence X are supplied to the temporal filtering unit TF and to subtraction unit SB (i.e, addition with one input inverted). In the subtraction unit SB, the image S(n−1) of the sequence S is subtracted pixel-by-pixel from the image X(n) of the sequence X, resulting in a difference image D(n) referred to as the prediction error. This prediction error is subjected to spatial low-pass filtering in a spatial low-pass filter TPF. Numerous versions of such low-pass filters are known to those skilled in the field of image processing. The selection of a suitable version can therefore be made by a person skilled in the art dependent on the specific application.

The output of the spatial low-pass filter TPF is a spatially low-pass-filtered prediction error L(n), which is employed together with a variance factor k(n) for calculating a filter coefficient a(n) for the temporal low-pass filter TF. This can occur using the indicated, recursire relationships or—more simply and faster—using a table LT (look up table). The variance factors are intermediately stored in a gain buffer GB; they are in turn temporally recursively calculated from the filter coefficients a(n).

The output S(n) from the temporal filter TF can be optionally supplied to one of an image memory IM for retention therein or an output unit OU such as a monitor or printer, or to both.

At the same time, FIG. 1 constitutes a flowchart of the inventive method itself. The temporal filter TF calculates a second image sequence (S) from a first image sequence (X) using a sequence of filter coefficients a(n). The output image sequence (S) is intermediately stored in an image memory (buffer B) and is subtracted from the input image sequence in a subtractor SUB for calculating difference images that follows this image memory. The result of this subtraction, the prediction error, is subsequently subjected to a pixel-by-pixel, spatial low-pass filtering (in the spatial low-pass filter TFP), and the low-pass-filtered prediction error L(n) is used for calculating the temporal sequence of filter coefficients a(n) for the temporal filtering. This preferably occurs with the assistance of a table LT (look up table) of filter coefficients in a memory provided for this purpose. To that end, a sequence of intermediate quantities, the variance factors $k(n)$, is calculated in recursive fashion from the values of the filter coefficients $a(n)$. In particular, the a priori probability (p) for the appearance of motion, the estimated noise power ($C^2$) in the image sequence (X) and the area-wise size (U) of the low-pass filter TFP employed enter into the calculation of the filter coefficients $a(n)$. The method illustrated by FIG. 1 means that the recursive procedure $$S(n) = a(n) \cdot S(n-1) + (1-a(n)) \cdot X(n) \text{ with } S(0) = X(0)$$

$$a(n) = \frac{1}{1 + \frac{1}{k(n-1)} + \frac{b^2(n) \cdot L^2(n)}{c^2}}$$

$$k(n) = \frac{k(n-1)}{a^2(n) + (1-a(n))^2 \cdot k(n-1)} \text{ with } k(0) = 1$$

$$b(n) = \frac{1}{1 + \frac{1-p}{p} \cdot \exp\left(-\frac{U \cdot L^2(n)}{2c^2}\right)}$$

is applied to the image sequences, whereby $L(n)$ is a spatially low-pass-filtered prediction error $D(n)=X(n)-S(n-1)$ over an environment of the size U of a pixel being observed, and $n=1,2, \ldots$ a time index, $a(n)=$a sequence of filter coefficients, $k(n)=$a sequence of variance factors, $b(n)=$a sequence of estimated a posterior probabilities for the occurrence of motion in a pixel being observed, $p=$an a priori probability for the occurrence of motion in the pixel being observed, $U =$the area-wise expanse of a low-pass filter mask (TFP) and $c^2=$the estimated noise power in the image sequence X.

For simplifying the described method, numerical tables (look up tables) can be advantageously utilized. The complexity of the inventive method is determined by the low-pass filtering (TFP) and by the temporal filtering. For the temporal filtering, the calculation of the coefficient sequence $a(n)$ as well as the calculation of the coefficient sequence $k(n)$ can be simplified by employing tables. A few frequently required intermediate results are thereby calculated in advance, so that these no longer need be calculated during the method execution. To this end, the sequence of filter coefficients $a(n)$ and the sequence of intermediate quantities $k(n)$ is quantized in a suitable way, so that they can be presented by whole numbers. Typically, only 65 different values are thereby allowed for $a(n)$, these being uniformly distributed within the interval between 0 and 1. A division into 50 different values, and thus 50 table entries, typically suffice for presentation of the variance factor $k(n)$. The quantized values are thereby placed more densely as they come to be closer to 1, because a higher precision is required here. Accordingly, the spacings of the values become larger the farther these are from 1. The largest quantized value in the table could, for example, lie at 50. Using these quantized values, one obtains to matrix-like table which allocates a new value for each of $a(n)$ and $k(n)$ to every possible value of the prediction error and to every possible value of a given variance factor. Finally, the temporal filtering itself, wherein images are to be multiplied by filter coefficients and are to be subsequently added, can be implemented using a multiplication table.

Although modifications and changes may be suggested by those skilled in the art, it is the intention of the inventors to embody within the patent warranted hereon all changes and modifications as reasonably and properly come within the scope of their contribution to the art.

We claim as our invention:

1. Method for producing a reduced-noise digital image sequence, comprising the steps of:

obtaining a first chronological sequence X of digital images; and generating a second sequence S of digital images with reduced noise from said first chronological sequence X according to the following recursive steps applied pixel-by-pixel to the images in said first chronological sequence X;

generating an image S(n) for a time index n according to $S(n)=a(n) \cdot S(n-1)+(1-a(n)) \cdot X(n)$ with $S(0)=X(0)$, wherein $n=1,2, \ldots$ is a time index identifying the chronological position of an image in each sequence X and S, $a(n)$ is a sequence of filter coefficients and $k(n)$ is a sequence of variance factors, generating said filter coefficients $a(n)$ for a time index n according to $$a(n) = \frac{1}{1 + \frac{1}{k(n-1)} + \frac{b^2(n) \cdot L^2(n)}{c^2}},$$

wherein $L(n)$ is a prediction error formed by spatially low-pass-filtering a recursively formed difference $X(n)-S(n-1)$ over an environment having a size U of a pixel being observed, and wherein $b(n)$ is a sequence of a posterior probabilities for the occurrence of motion in a pixel being observed;

generating said variance factors $k(n)$ for a time index n according to $$k(n) = \frac{k(n-1)}{a^2(n)+(1-a(n))^2 \cdot k(n-1)}$$

with $k(0)=1$, and estimating said posteriori possibilities $b(n)$ for the occurrence of motion in a pixel being observed, for a time index n according to $$b(n) = \frac{1}{1+\frac{1-p}{p} \cdot \exp\left(-\frac{U \cdot L^2(n)}{2c^2}\right)},$$

wherein p is an a priori probability for the occurrence of motion in the pixel being observed, and $c^2$ is the estimated noise power in the image sequence X.

2. An apparatus for producing a reduced-noise digital image sequence, comprising:

means for obtaining a first chronological sequence X of digital images; and means for generating a second sequence S of digital images with reduced noise from said first chronological sequence X by acting recursively pixel-by pixel on the images in said first chronological sequence X, including:

means for generating an image S(n) for a time index n according to $S(n)=a(n) \cdot S(n-1)+(1-a(n)) \cdot X(n)$ with $S(0)=X(0)$, wherein $n=1,2, \ldots$ is a time index identifying the chronological position of an image in each sequence X and S, $a(n)$ is a sequence of filter coefficients and $k(n)$ is a sequence of variance factors, means for generating said filter coefficients $a(n)$ for a time index n according to $$a(n) = \frac{1}{1 + \frac{1}{k(n-1)} + \frac{b^2(n) \cdot L^2(n)}{c^2}}$$

wherein L(n) is a prediction error formed by spatially low-pass-filtering a recursively formed difference X(n)–S(n–1) over an environment having a size U of a pixel being observed, and wherein b(n) is a sequence of a posterior probabilities for the occurrence of motion in a pixel being observed;

means for generating said variance factors k(n) for a time index n according to $$k(n) = \frac{k(n-1)}{a^2(n) + (1 - a(n))^2 \cdot k(n-1)}$$

with k(0)=1, and means for estimating said posteriori possibilities b(n) for the occurrence of motion in a pixel being observed, for a time index n according to $$b(n) = \frac{1}{1 + \frac{1-p}{p} \cdot \exp\left(-\frac{U \cdot L^2(n)}{2c^2}\right)}.$$

wherein p is an a priori probability for the occurrence of motion in the pixel being observed, and $c^2$ is the estimated noise power in the image sequence X.

\* \* \* \* \*